United States Patent
Campbell et al.

(10) Patent No.: US 7,420,808 B2
(45) Date of Patent: Sep. 2, 2008

(54) LIQUID-BASED COOLING SYSTEM FOR COOLING A MULTI-COMPONENT ELECTRONICS SYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/539,910

(22) Filed: Oct. 10, 2006

(65) Prior Publication Data

US 2008/0084664 A1  Apr. 10, 2008

(51) Int. Cl.
*H05K 7/20* (2006.01)
*F28F 7/00* (2006.01)

(52) U.S. Cl. ............... 361/699; 165/80.4; 361/702; 361/711

(58) Field of Classification Search ........... 361/699, 361/701, 702, 712
See application file for complete search history.

(56) References Cited

U.S. PATENT DOCUMENTS

| 7,011,143 | B2 | 3/2006 | Corrado et al. | 165/80.4 |
| 7,187,549 | B2 * | 3/2007 | Teneketges et al. | 361/699 |
| 7,272,006 | B2 * | 9/2007 | Mongia et al. | 361/702 |
| 7,280,363 | B2 * | 10/2007 | Reyzin et al. | 361/719 |
| 2004/0221604 | A1 * | 11/2004 | Ota et al. | 62/259.2 |
| 2005/0151244 | A1 * | 7/2005 | Chrysler et al. | 257/713 |
| 2006/0065874 | A1 * | 3/2006 | Campbell et al. | 251/348 |

OTHER PUBLICATIONS

Colbert et al., "Method and Apparatus for Mounting a Heat Sink in Thermal Contact with an Electronic Component", U.S. Appl. No. 11/201,972, filed Aug. 11, 2005.
Colbert et al., "Heatsink Apparatus for Applying a Specified Compressive Force to an Integrated Circuit Device", U.S. Appl. No. 11/460,334, filed Jul. 27, 2006.

* cited by examiner

*Primary Examiner*—Gregory D Thompson
(74) *Attorney, Agent, or Firm*—Lily Neff, Esq.; Kevin P. Radigan, Esq.; Heslin Rothenberg Farly & Metsiti P.C.

(57) ABSTRACT

A system for cooling an electronics system is provided. The cooling system includes a monolithic structure preconfigured for cooling multiple electronic components of the electronics system when coupled thereto. The monolithic structure includes multiple liquid-cooled cold plates configured and disposed in spaced relation to couple to respective electronic components; a plurality of coolant-carrying tubes metallurgically bonded in fluid communication with the multiple liquid-cooled cold plates, and a liquid-coolant header subassembly metallurgically bonded in fluid communication with multiple coolant-carrying tubes. The header subassembly includes a coolant supply header metallurgically bonded to coolant supply tubes and a coolant return header metallurgically bonded to coolant return tubes. When in use, the multiple liquid-cooled cold plates engage respective electronic components of the electronics system, and liquid coolant is distributed through the liquid-coolant header subassembly and plurality of coolant-carrying tubes to the cold plates for removal of heat generated by the respective electronic components.

16 Claims, 13 Drawing Sheets

LIQUID-BASED COOLING SYSTEM FOR COOLING A MULTI-COMPONENT ELECTRONICS SYSTEM

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Hybrid Cooling System and Method for a Multi-Component Electronics System", Campbell et al., Ser. No. 11/539,902, filed Oct. 10, 2006, "Cooling System and Method for a Multi-Component Electronics System Employing Conductive Heat Transport", Campbell et al., Ser. No. 11/539,905, filed Oct. 10, 2006;

"Method of Assembling a Cooling System for a Multi-Component Electronics System", Campbell et al, Serial No. 11/539,907, filed Oct. 10, 2006;

"Method and Apparatus for Mounting a Heat Sink in Thermal Contact with an Electronic Component", Colbert et al, Ser. No. 11/201,972, filed Aug. 11, 2005; and "Heatsink Apparatus for Applying a Specified Compressive Force to an Integrated Circuit Device", Colbert et al, Ser. No. 11/460,334, filed Jul. 27, 2006.

TECHNICAL FIELD

The present invention relates in general to cooling an electronics system, and more particularly, to a liquid-based cooling system for cooling a multi-component electronics system. Still more particularly, the present invention relates to a liquid-based cooling system comprising a monolithic structure preconfigured for cooling multiple heat generating electronic components of an electronics system, wherein the monolithic structure includes multiple liquid-cooled cold plates disposed is spaced relation and configured to couple to respective heat generating electronic components of the electronics system.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.), are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPMs) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

Accordingly, there is a significant need for enhanced cooling mechanisms for electronic components, individually and at all levels of packaging, including for example, rack-mounted or blade-mounted electronic components of various large computer systems today.

SUMMARY OF THE INVENTION

The need to cool current and future high heat load, high heat flux electronic components requires development of aggressive thermal management techniques, such as liquid-based cooling systems and methods of fabrication. The concepts disclosed herein address the need for enhanced liquid-based cooling systems for facilitating cooling of a multi-component electronics system.

Briefly summarized, the present invention comprises in one aspect a cooling system for cooling an electronics system. The cooling system includes a monolithic structure preconfigured for cooling multiple heat generating electronic components of the electronics system when coupled thereto. The monolithic structure includes: multiple liquid-cooled cold plates configured and disposed in spaced relation to engage respective heat generating electronic components of the electronics system to be cooled; a plurality of coolant-carrying tubes metallurgically bonded in fluid communication with the multiple liquid-cooled cold plates; and a liquid-coolant header subassembly metallurgically bonded in fluid communication with multiple coolant-carrying tubes of the plurality of coolant-carrying tubes, the liquid-coolant header subassembly including a coolant supply header metallurgically bonded in fluid communication with coolant supply tubes of the multiple coolant-carrying tubes and a coolant return header metallurgically bonded in fluid communication with coolant return tubes of the multiple coolant-carrying tubes. When in use, the multiple liquid-cooled cold plates engage the respective heat generating electronic components of the multiple heat generating electronic components to be cooled, and liquid coolant is distributed by the liquid-coolant header subassembly through the plurality of coolant-carrying tubes and the multiple liquid-cooled cold plates for removal of heat generated by the respective heat generating electronic components.

In a further aspect, a cooled electronics system is provided. The cooled electronics system includes an electronics drawer of an electronics rack. The electronics drawer comprises a component layout containing multiple heat generating electronic components to be cooled. The cooled electronics system further includes a liquid-based cooling system for cooling the multiple heat generating electronic components of the electronics drawer. The cooling system comprises a monolithic structure preconfigured for the electronics drawer and coupled to the multiple heat generating electronic components of the electronics drawer. The monolithic structure includes: multiple liquid-cooled cold plates preconfigured in spaced relation and coupled to respective heat generating electronic components of the electronics drawer; a plurality of coolant-carrying tubes metallurgically bonded in fluid communication with the multiple liquid-cooled cold plates; and a liquid-coolant header subassembly metallurgically bonded in fluid communication with the multiple coolant-carrying tubes of the plurality of coolant-carrying tubes, the liquid-coolant header subassembly including a coolant supply header metallurgically bonded in fluid communication with coolant supply tubes of the multiple coolant-carrying tubes and a coolant return header metallurgically bonded in fluid communication with the coolant return tubes of the multiple coolant-carrying tubes. When operational, liquid coolant is distributed by the liquid-coolant header subassembly through the plurality of coolant-carrying tubes and the multiple liquid-cooled cold plates for removal of heat generated by the respective heat generating electronic components of the electronics drawer.

In a still further aspect, a cooled electronics system is provided which includes an electronics rack and a liquid-based cooling system. The electronics rack comprises at least one electronics drawer having a component layout containing multiple heat generating electronic components to be cooled. The liquid-based cooling system is coupled to the multiple heat generating electronic components of the electronics drawer, and is a monolithic structure preconfigured for cooling selected components of the electronics drawer. The monolithic structure includes: multiple liquid-cooled cold plates preconfigured in spaced relation and coupled to respective heat generating electronic components within the electronics drawer; a plurality of coolant-carrying tubes metallurgically bonded in fluid communication with the multiple liquid-cooled cold plates; and a liquid-coolant header subassembly metallurgically bonded in fluid communication with multiple coolant-carrying tubes of the plurality of coolant-carrying tubes. The liquid-coolant header subassembly includes a coolant supply header metallurgically bonded in fluid communication with coolant supply tubes of the multiple coolant-carrying tubes and a coolant return header metallurgically bonded in fluid communication with the coolant return tubes of the multiple coolant-carrying tubes. When operational, liquid coolant is distributed by the liquid-coolant header subassembly through the plurality of coolant-carrying tubes and the multiple liquid-cooled cold plates for removal of heat generated by the respective heat generating electronic components of the electronics drawer.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having multiple heat generating electronic components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within the electronics system, while "secondary heat generating component" refers to an electronic component of the electronics system generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

Figure 1:
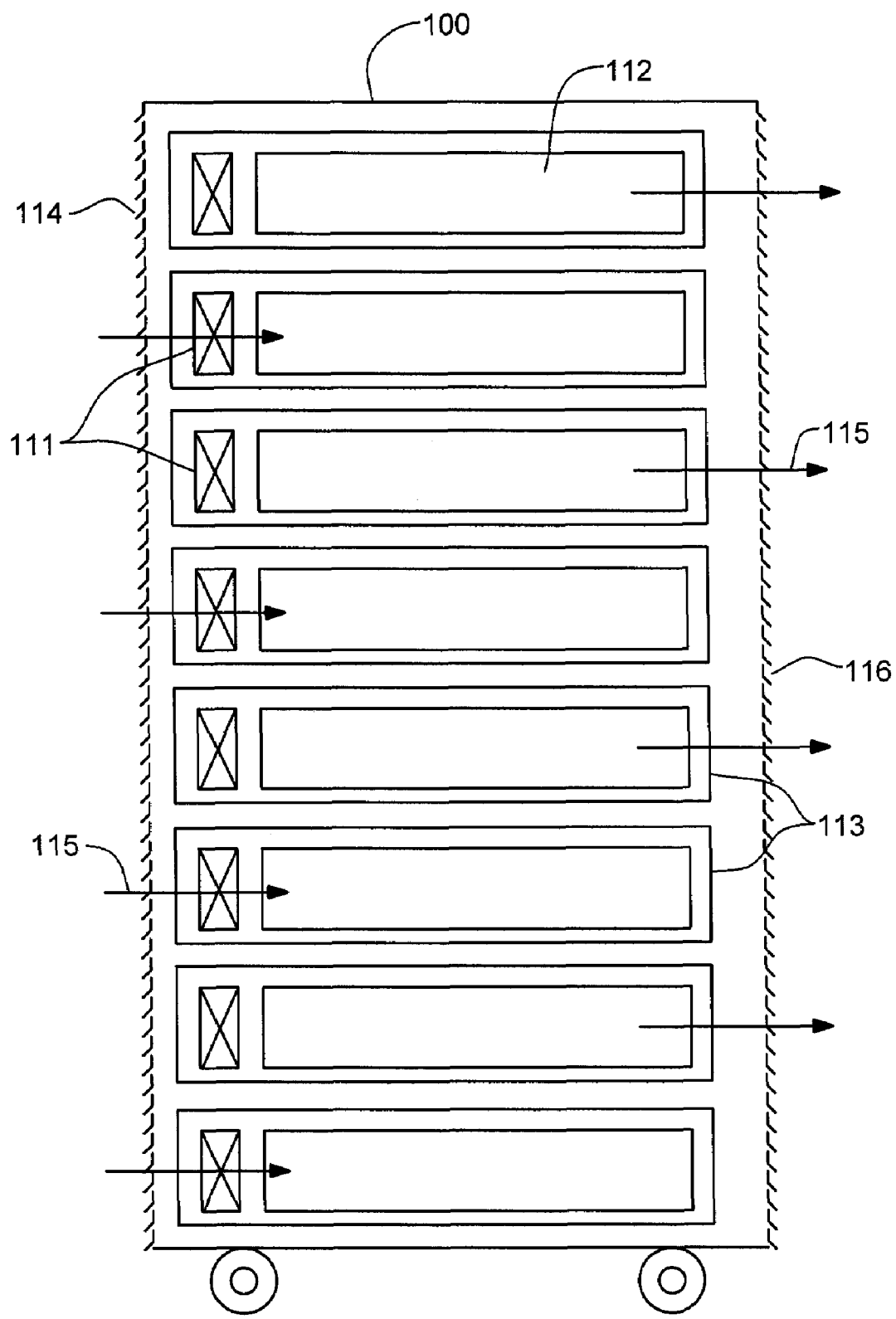
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
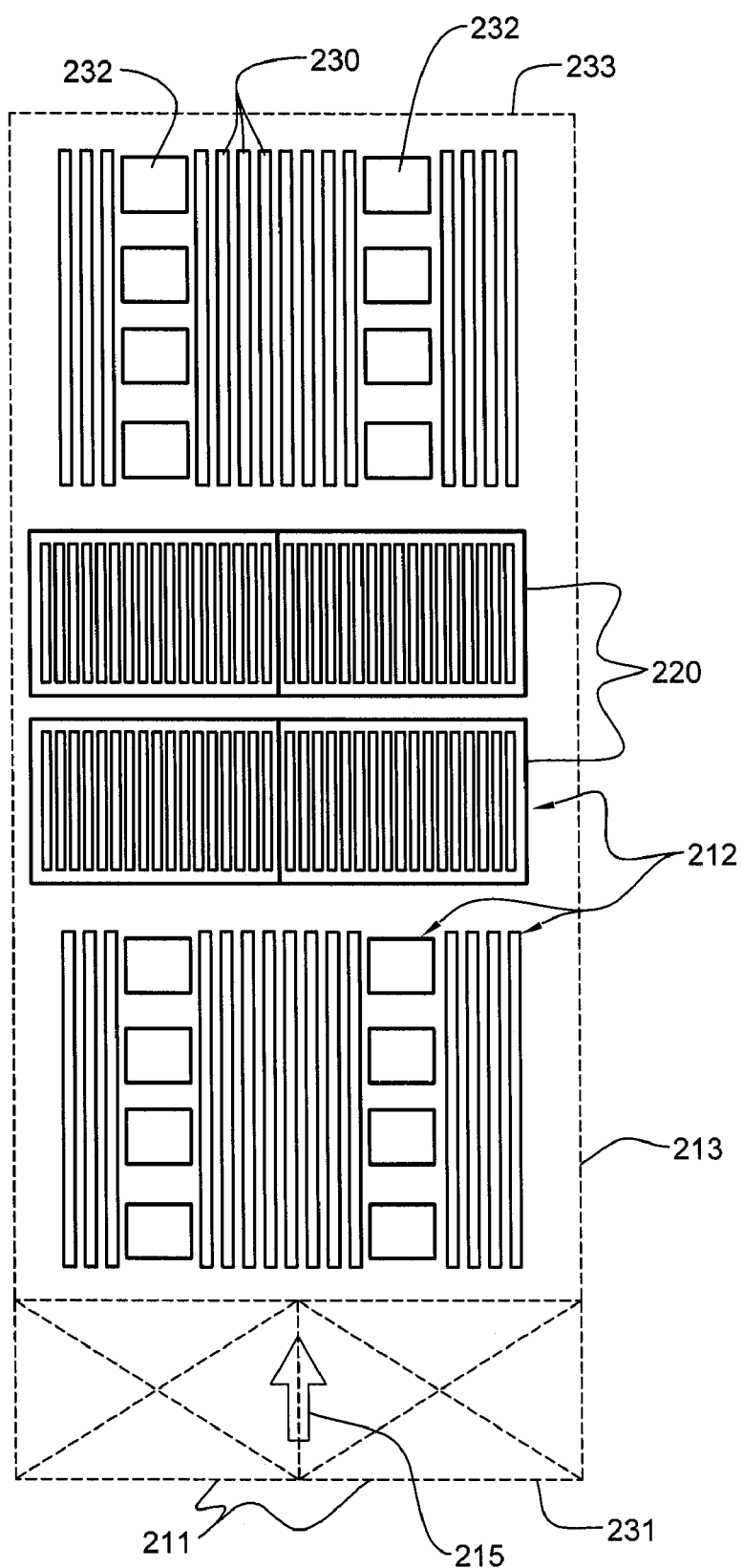
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) multiple rows of memory support modules 232 disposed between arrayed memory modules 230, such as air-cooled dual in-line memory module (DIMM) packages.

Electronic components are generally packaged using one or more electronic packages (i.e., modules) that include a module substrate to which the device is electrically connected. In some cases, the module includes a cap (i.e., a capped module) which seals the electronic device within the module. In other cases, the module does not include a cap (i.e., is a bare die module).

Bare dies are generally preferred over capped modules from a thermal performance perspective. In the case of a capped module, a heat sink is typically attached with a thermal interface between a bottom surface of the heat sink and a top surface of the cap, and another thermal interface between a bottom surface of the cap and a top surface of the electronic device. In the case of a bare die, a heat sink is typically attached with a thermal interface between a bottom surface of the heat sink and a top surface of the electronic device. Bare dies typically exhibit better thermal performance than capped modules because bare dies eliminate two sources of thermal resistance present in capped modules, i.e., the thermal resistance of the cap and the thermal resistance of the thermal interface between the cap and the electronic device. Accordingly, bare dies may be preferred for electronic components that have high power dissipation.

Air-cooled heat sinks are attached to modules using a variety of attachment mechanisms, such as clamps, screws and other hardware. The attachment mechanism typically applies a force that maintains a thermal interface gap, i.e., the thickness of the thermal interface extending between the heat sink and the module. In the case of a capped module, the cap protects the electronic device from physical damage from the applied force. In the case of a bare die, however, the applied force is transferred directly through the electronic device itself. Consequently, when bare dies are used, the attachment mechanism typically applies a compliant force to decrease stresses on the electronic component.

FIGS. 3-7 depict one enhanced mounting mechanism for holding an air-cooled heat sink in thermal contact with an electronic component. Generally stated, in this embodiment, the air-cooled heat sink apparatus comprises a load frame having load springs and an open region that exposes the electronic component. The load frame is mounted to a circuit board on which the electronic component is mounted. The air-cooled heat sink is disposed on the load frame and has a main body in thermal contact with the electronic component through a thermally conductive material. The air-cooled heat sink has load arms for engaging the load springs. A load plate extends between the load arms and has an actuation element operative to displace the main body relative to the load plate and thereby resiliently deform the load springs and produce a load force that compresses the thermally conductive material to achieve a desired thermal interface gap between the main body and the electronic component. Non-influencing fasteners secure the air-cooled heat sink to the load frame and maintain the desired thermal interface gap.

Figure 3:
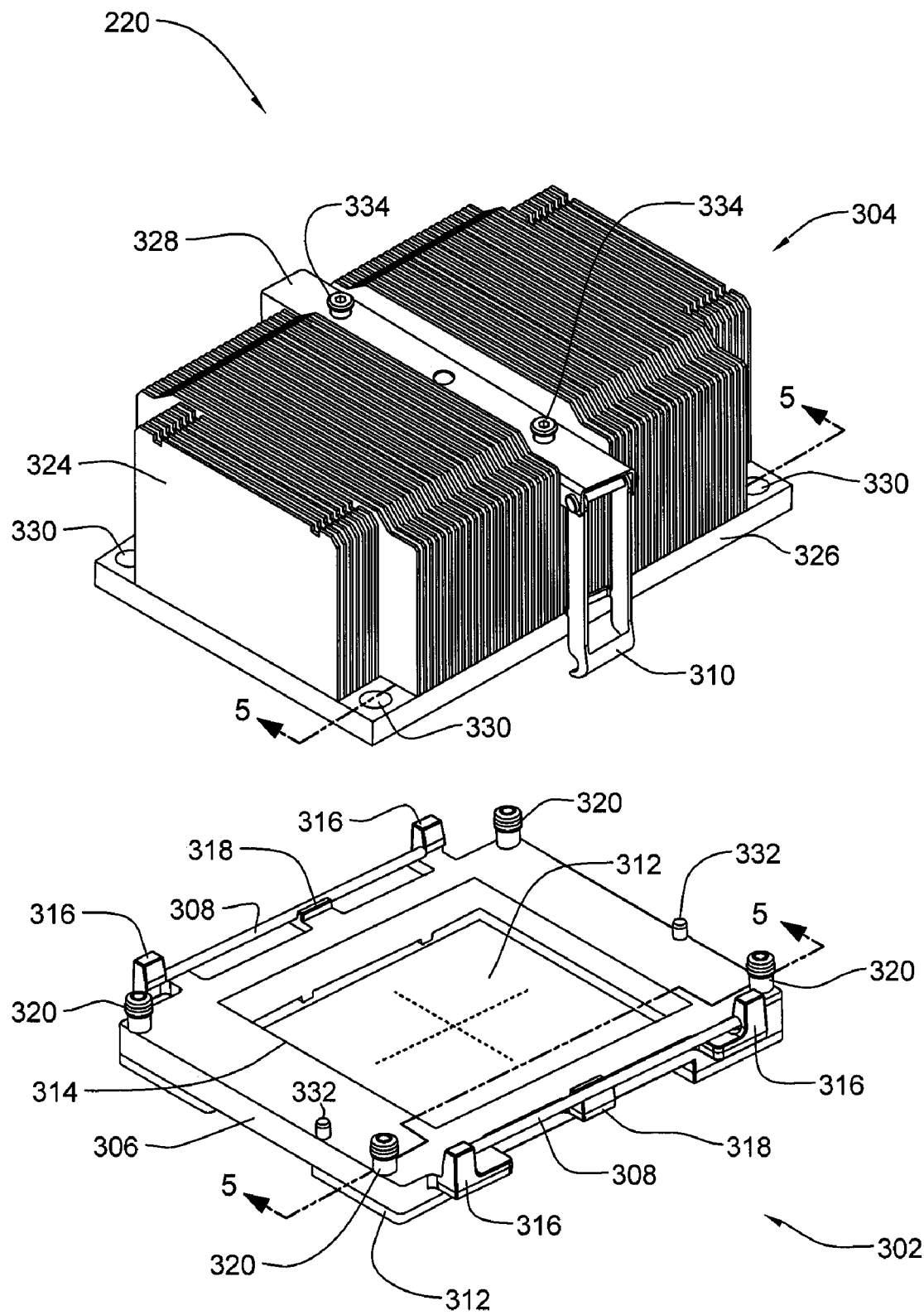
FIG. 3 is a partially exploded perspective view of an air-cooled heat sink apparatus, in accordance with an aspect of the present invention.
Figure 4:
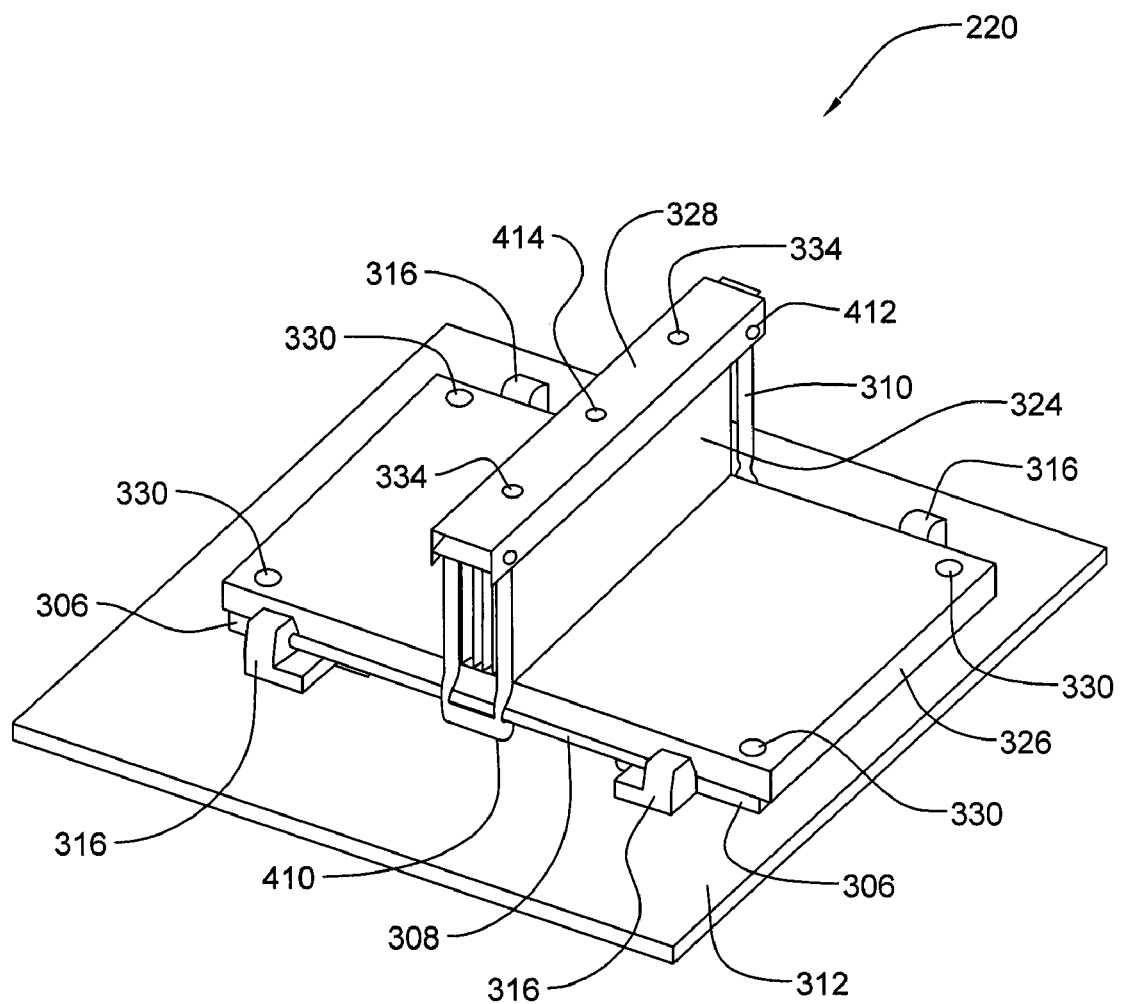
FIG. 4 is a partial perspective view of the air-cooled heat sink apparatus of FIG. 3, in accordance with an aspect of the present invention.
Figure 5:
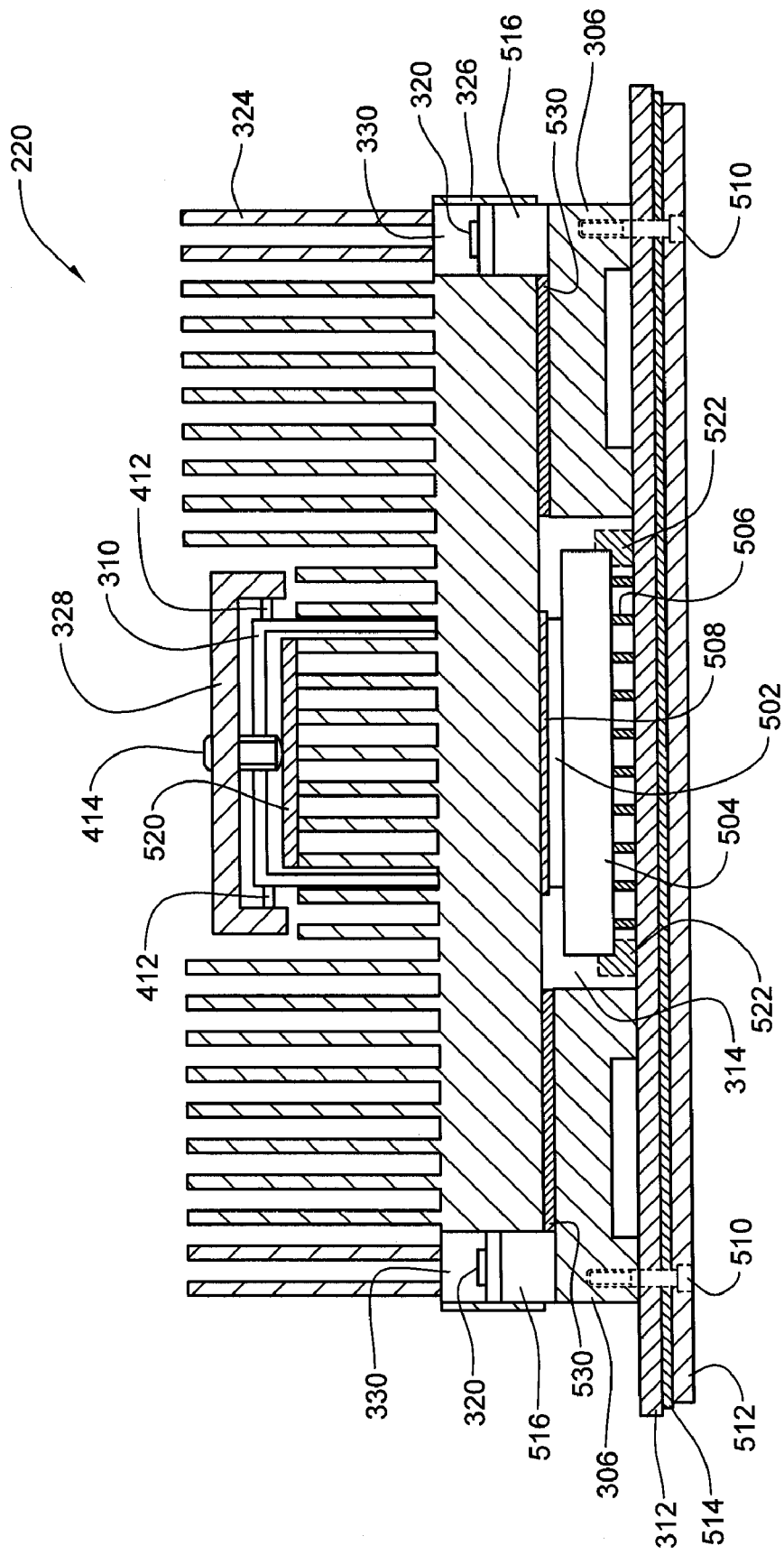
FIG. 5 is a cross-sectional elevational view of an air-cooled heat sink apparatus and electronic component assembly, taken (for example) along line 5-5 of FIG. 3, in accordance with an aspect of the present invention.

Referring to FIGS. 3-5, an air-cooled heat sink 220 is illustrated, which implements an improved process for mounting the heat sink onto the heat source, such as an electronic component. FIGS. 3-5 illustrate major components of an air-cooled heat sink apparatus 220 at a high level, and it should be understood that the number, type and configuration of components may vary depending upon the implementation. For example, the apparatus may contain a different number, type and configuration of electronic modules to be cooled.

As best shown in FIG. 3, air-cooled heat sink apparatus 220 includes two main components, i.e., a load frame/spring assembly 302 and a heat sink/load arm assembly 304. Load frame/spring assembly 302 includes a load frame 306 and a pair of load springs 308. Load frame 306 is preferably made of an alloy material chosen for its low creep properties, such Zamak 8. Zamak 8, also known as ZA-8, is the trade name for a zinc-based alloy, the primary components of which are zinc, aluminum, copper, and magnesium. Creep is the development over time of additional strains in a material. Creep depends on the magnitude of the applied force and its duration, as well as the temperature and pressure. A material having high creep resistance is preferable in the construction of load frame 306 because creep deformation is to be avoided.

Load springs 308 are preferably made of an alloy material chosen for its high tensile strength properties, such as high strength music wire. Although two load springs 308 are shown in FIG. 3, those skilled in the art will appreciate that the present invention may be practiced with any number of load springs 308 (and load arms 310, which engage the load springs 308 as described below in the discussion of heat sink/load arm assembly 304).

Load frame 306 is mounted on a printed circuit board 312. Referring to FIG. 5, fasteners such as screws 510 (two of which are denoted with dotted lines in FIG. 5) are used to attach load frame 306 to printed circuit board 312. In one embodiment, four screws 510 (i.e., one near each corner of load frame 306) pass through thru-holes in a backside stiffener 512, an insulator 514 such as a polyimide, and printed circuit board 312, and are received in threaded holes in load frame 306. This configuration advantageously allows access to screws 510 even when the heat sink/load arm assembly is attached to the load frame/spring assembly.

Returning to FIG. 3, load frame 306 includes one or more open regions 314 into which extends the heat source, e.g., an electronic component (not shown) mounted on printed circuit board 312. For example, a bare die may be mounted on printed circuit board 312 at the location designated at the intersection of the cross-hairs shown in FIG. 3.

As shown in FIG. 3, load frame 306 includes four mounting projections 316 to which the ends of load springs 308 are secured. Load frame 306 also includes two downstop support projections 318 on which rest the mid-sections of load springs 308.

One or more non-influencing fasteners 320 are used to secure heat sink/load arm assembly 304 to load frame/load arm assembly 302. By way of example, four non-influencing fasteners 320 are mounted on load frame 306. Each non-influencing fastener 320 is threaded into a boss 516 (FIG. 5) of load frame 306. The non-influencing fasteners (NIFs) lock the heat sink in position without influencing the position of the heat sink.

Heat sink/load arm assembly 304 includes a heat sink 324 having a base plate 326. Preferably, heat sink 324 is formed with fins, pins or other similar structures to increase the surface area of the heat sink and thereby enhance heat dissipation as air passes over the heat sink. It is also possible for heat sink 324 to contain high performance structures, such as vapor chambers and/or heat pipes, to further enhance heat transfer. For example, heat sink 324 may contain one or more vapor chambers (not shown) charged with deionized water. Heat sink 324 may, for example, be formed of metal, such as copper or aluminum, or of other thermally conductive material, such as graphite-based material.

As mentioned above, heat sink/load arm assembly 304 includes load arms 310. Load arms 310 are hingedly attached to a U-channel load plate 328. Load arms 310 and U-channel load plate 328 may be made of stainless steel, for example, and be configured to provide minimal air flow impedance across the fins of heat sink 324. For example, load arms 310 have an open area through which air may flow. When heat sink/load arm assembly 304 is attached to load frame/spring assembly 302, load arms 310 engage load springs 308. This engagement is described in detail below with reference to FIGS. 4 & 5. In addition, when heat sink/load arm assembly 304 is attached to load frame/spring assembly 302, non-influencing fasteners 320 are received in bore holes 330 in the heat sink's base plate 326. This non-influencing fastener arrangement is described further below with reference to FIGS. 5-6A. To aid in alignment of heat sink/load arm assembly 304 with respect to load frame/spring assembly 302, load frame 306 may include alignment pins 332, which are received in corresponding alignment holes (not shown) in the heat sink's base plate 326.

FIG. 4 is a perspective view of a heat transfer apparatus 220 with portions of heat sink 324 removed. FIG. 5 is a cross-sectional view of heat transfer apparatus 220 engaging an electronic component assembly. As shown in FIGS. 4 & 5, an actuation mechanism applies a preload force to heat sink 324 toward a semiconductor chip 502 (FIG. 5) to compress a thermally conductive material 508 (FIG. 5) and achieve a desired thermal interface gap between heat sink 324 and semiconductor chip 502. The main components of the actuation mechanism include load frame 306, the load frame's mounting projections 316, load springs 308, load arms 310, the load arms' hook portions 410, hinge pins 412, U-channel load plate 328, actuation screw 414, push plate 520, the push plate's guide pins 334, heat sink 324, and the heat sink's base plate 326. Referring to FIG. 3, load arms 310 each include a hook portion 410 that engages one of the load springs 308. Load arms 310 are hingedly attached to U-channel load plate 328 by hinge pins 412. An actuation screw 414 is threaded through U-channel load plate 328 to engage an underlying push plate 520 (FIG. 5). Actuation screw 414 may be, for example, an M3 screw. Actuation screw 414 is accessible for actuation from the top of U-channel load plate 328. The distance between the U-channel plate and push plate 520 is adjusted by turning actuation screw 414. This provides a controlled rate of loading. Those skilled in the art will recognize that other actuation elements and techniques to provide a controlled rate of loading are possible within the scope of the present invention, such as camming, rocking and the like.

Still referring to FIG. 4, when the load frame/spring assembly and the heat sink/load arm assembly are brought together, hook portions 410 of load arms 310 are engaged with load springs 308, and the actuation mechanism is actuated by turning actuation screw 414 in a direction to increase the distance between U-channel load plate 328 and the underlying push plate 520 (FIG. 5). Load springs 308 are deflected by actuation of the actuation mechanism. The geometric parameters of load springs 308, (i.e., the span, cross-section profile, and diameter) are optimized for the allowable space within the application and the required resulting load. Force is transmitted through the heat sink's fins and base plate 326 onto the underlying semiconductor chip 502 (FIG. 5). The force compresses a thermally conductive material 508 (FIG. 5) and achieves a desired thermal interface gap between heat sink's base plate 326 and semiconductor chip 502.

Referring to FIG. 5, push plate 520 is affixed to heat sink 324. For example, push plate 520 may be soldered to heat sink 324 using, for example, SAC 305 solder. Alternatively, push plate 520 may be affixed to heat sink 324 with a suitable adhesive, such as epoxy. Push plate 520 may be made of stainless steel, for example. In one embodiment, push plate 520 is affixed in a location directly above the heat source, with the width of U-channel load plate 328 and push plate 520 substantially capturing the footprint of the heat source. This provides centroidal loading above the bare die, and thus provides substantially no edge stress on the die. As shown in FIG. 5, for example, push plate 520 is affixed to multiple heat sink's fins lying above semiconductor chip 402. Although not shown in FIG. 5, additional modules residing on printed circuit board 312 may be accommodated in open area 314 of load frame 306. In such a case, push plate 520 may be affixed in a location directly over the primary module, with the width of U-channel load plate 328 and push plate 520 substantially capturing the footprint of the primary module.

As shown in FIGS. 3 and 4, the push plate includes guide pins 334 that extend through corresponding holes in U-channel load plate 328. The purpose of guide pins 334 is to align push plate 520 relative to U-channel load plate 328.

As shown in FIG. 5, in one embodiment, the heat generating electronic component comprises one or more bare dies, including a semiconductor chip 502, a module substrate 504, and an electronic connector 506. However, those skilled in the art will appreciate that the present invention may be practiced using other types of heat sources such as one or more capped modules and/or other electronic components. The bare die shown in FIG. 5 is a single-chip module (SCM); however, those skilled in the art will recognize that the spirit and scope of the present invention is not limited to SCMs. For example, those skilled in the art will recognize that the present invention may be practiced using one or more multi-chip modules (MCMs), or a combination of MCMs, SCMs and/or other electronic components/heat sources.

It is significant to note that the present invention allows a single heat transfer apparatus to accommodate one or more modules having different footprints. Previous solutions required qualification of individual modules based on differences in footprint. The present invention overcomes this drawback.

The bare die is conventional. Semiconductor chip 502 is electrically connected to module substrate 504. Electronic connector 506, which electrically connects printed circuit board 312 to module substrate 504, may be a pin grid array (PGA), a ceramic column grid array (CCGA), a land grid array (LGA), or the like.

In some cases, electronic connector 506 may be susceptible to being crushed by the force applied by the actuation mechanism. This is problematic not only from the perspective of possible damage to electronic connector 506, but it also throws off the planarity of the stack (i.e., the module substrate 504 and semiconductor chip 502) relative to the heat sink's base plate which causes thermally conductive material 508 to form an uneven thermal interface gap. In such cases, one or more crush protection elements 522 (denoted with a dotted line in FIG. 5) may be inserted along peripheral portions of module substrate 504 between the bottom of module substrate 504 and the top of printed circuit board 312. The crush protection elements 522 may be made of a material such as a polythermal plastic or the like.

Referring to FIG. 5, thermal interface 508 is made of a thermally conductive material such as thermal gel, grease, paste, oil, or other high thermal conductivity material. For example, thermal interface 508 may be made of Shin-Etsu gel or grease with aluminum and/or zinc oxide spheres. Typically, thermal interface 508 is relatively thin so that it may easily transfer heat away from semiconductor chip 502 towards the heat sink's base plate 326. The thickness of thermal interface 508 extending between the bottom of the heat sink's base plate 326 and the top surface of semiconductor chip 502 is referred to as the thermal interface gap. As one example, the thermal interface gap is about 1.2 mil.

Thermally conductive material 508 is dispensed on semiconductor chip 502 prior to bringing the load frame/spring assembly and the heat sink/load arm assembly together. To protect semiconductor 502 as these assemblies are initially brought together, a viscoelastic foam pad 530 may be interposed between the lower surface of the heat sink's base plate 326 and the upper surface of load frame 306.

Those skilled in the art will appreciate that the actuation mechanism shown in FIGS. 4 and 5 is exemplary, and that other actuation mechanisms may be used to apply the preload force within the spirit and scope of the present invention. According to one embodiment of the present invention, once the preload force is applied to achieve the desired thermal gap, irrespective of the actuation mechanism that applied the preload force, one or more non-influencing fasteners are actuated to secure the heat sink to the load frame and maintain the desired thermal gap.

Figure 6:
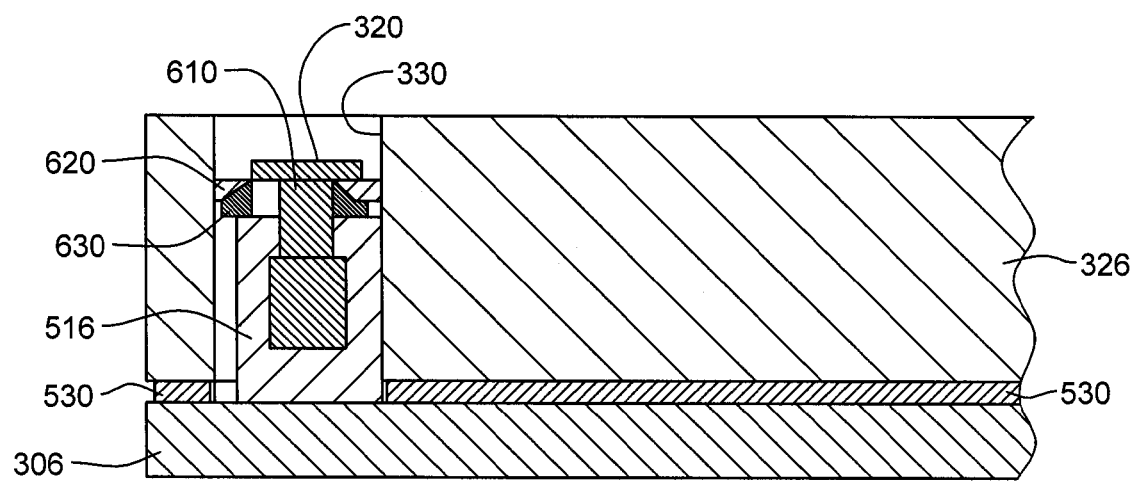
FIG. 6 is a cross-sectional view of a portion of the air-cooled heat sink apparatus of FIGS. 3-5, illustrating a non-influencing fastener arrangement in an actuated state, in accordance with an aspect of the present invention.
Figure 6A:
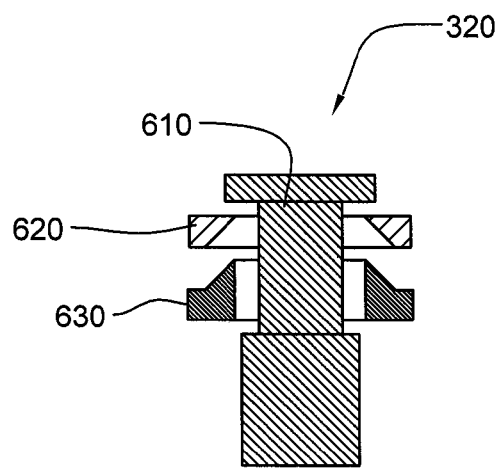
FIG. 6A is a cross-sectional view of the non-influencing fastener of FIG. 6, shown in a non-actuated state, in accordance with an aspect of the present invention.

As shown in FIG. 5, when the heat sink/load arm assembly is attached to the load frame/spring assembly, non-influencing fasteners 320 are received in bore holes 330 in the heat sink's base plate 326. Once the actuation mechanism applies the preload force to achieve the desired thermal interface gap, non-influencing fasteners 320 are actuated to secure heat sink 324 to load frame 306 and maintain the desired thermal gap. One embodiment of a non-influencing fastener arrangement is shown in more detail in FIGS. 6 and 6A. FIG. 6 shows a non-influencing fastener 320 in an actuated state, while FIG. 6A shows non-influencing fastener 320 in a non-actuated state. Non-influencing fastener 320 includes a screw 610 that is threaded into one of the bosses 516 of load frame 306. Captivated on screw 610 are a split taper ring 620 and a solid taper ring 630. Preferably, the taper of split taper ring 620 matches that of solid taper ring 630. Non-influencing fastener 320 is accessible through bore hole 330 in the heat sink's base plate 326, and is actuated by turning screw 610 into the load frame's boss 516 so that split taper ring 620 is expanded against the wall of bore hole 330 in the heat sink's base plate 326. Non-influencing fasteners 320 are advantageous because they can be actuated without significantly altering the thermal interface gap, as would be the case with a conventional fastener.

Figure 7:
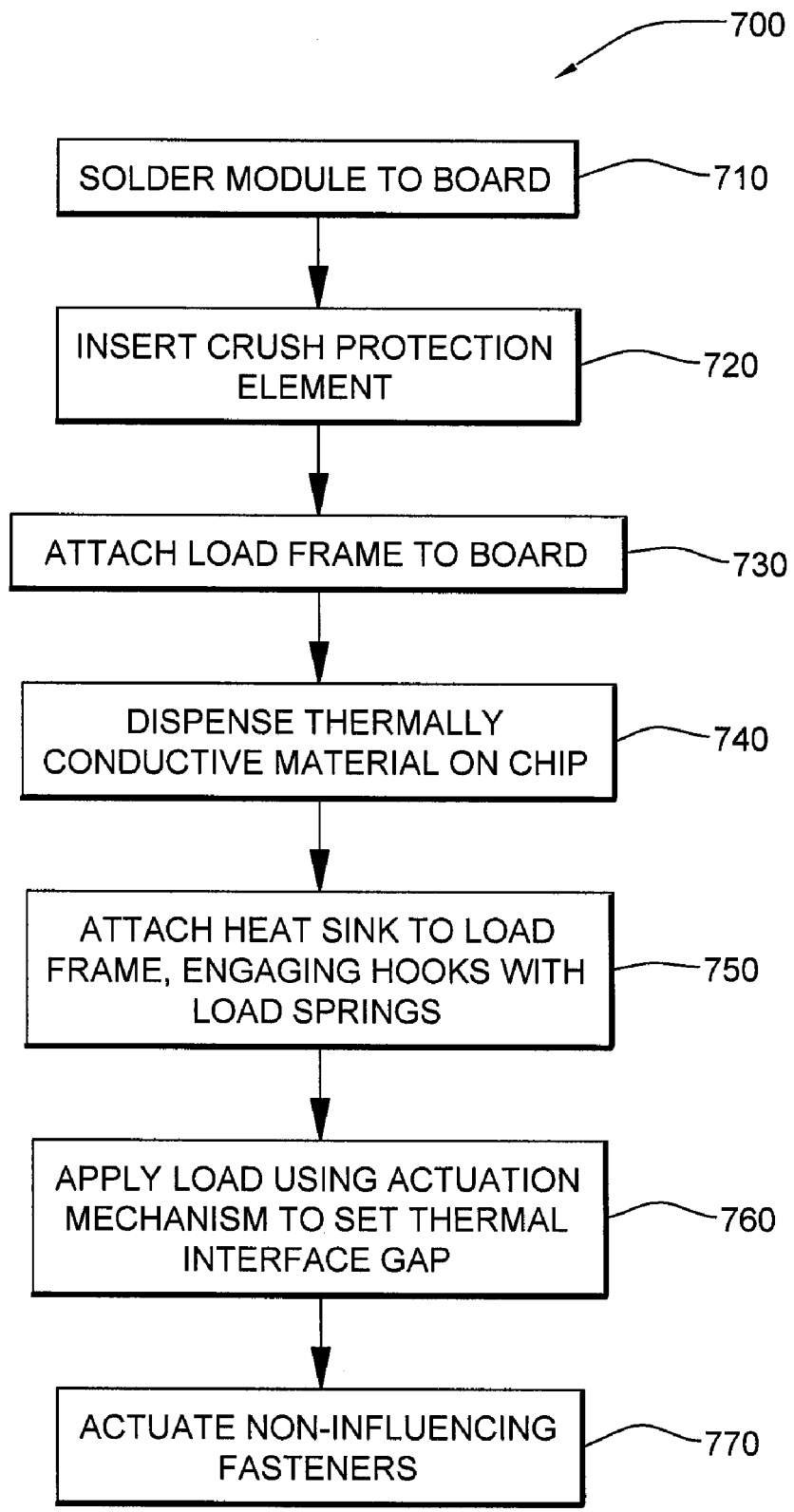
FIG. 7 is a flowchart of one embodiment of a method of mounting an air-cooled heat sink in thermal contact with one or more electronic components, in accordance with an aspect of the present invention.

FIG. 7 is a flow diagram of a method 700 for mounting a heat sink in thermal contact with an electronic component according to one embodiment of the present invention. Method 700 sets forth one order of steps. It should be understood, however, that the various steps may occur at any time relative to one another. Initially, the bare die is soldered to the printed circuit board 710. If a crush protection element is desired, then the crush protection element is inserted along peripheral portions of the module substrate between the bottom of the module substrate and the top of printed circuit board 720. The load frame is attached to the printed circuit board 730. Thermally conductive material is dispensed on the semiconductor chip 740. Next, the heat sink/load arm assembly is aligned and brought into contact with the load frame/spring assembly 750. During step 750, the hook portion of each load arms is brought into engagement with one of the load springs.

Method 700 continues with the application of a preload force using the actuation mechanism to set the thermal interface gap 760. During step 760, the actuation screw is turned an appropriate amount to apply a preload force (e.g., 40 lbs) that provides the desired thermal interface gap (e.g., 1.2 mil). In other words, some of the thermally conductive material is squeezed-out by the preload force to provide the desired thermal gap. Once this point is reached, the assembly may optionally be thermally cured to set the thermal interface gap. Next, the non-influencing fasteners are actuated to secure the heat sink to the load frame and maintain the desired thermal gap (step 770). Preferably, an appropriate torque is applied to the non-influencing fasteners using an X-pattern sequence to minimize the application of any stresses.

Thermal sensors may be used to measure the thermal interface gap achieved by method 700. If the desired thermal interface gap is not achieved, then the unit may be simply reworked by removing the heat sink/load arm assembly from the load frame/spring assembly, and cleaning the thermally conductive material from the semiconductor chip, and returning to step 740.

Figure 8:
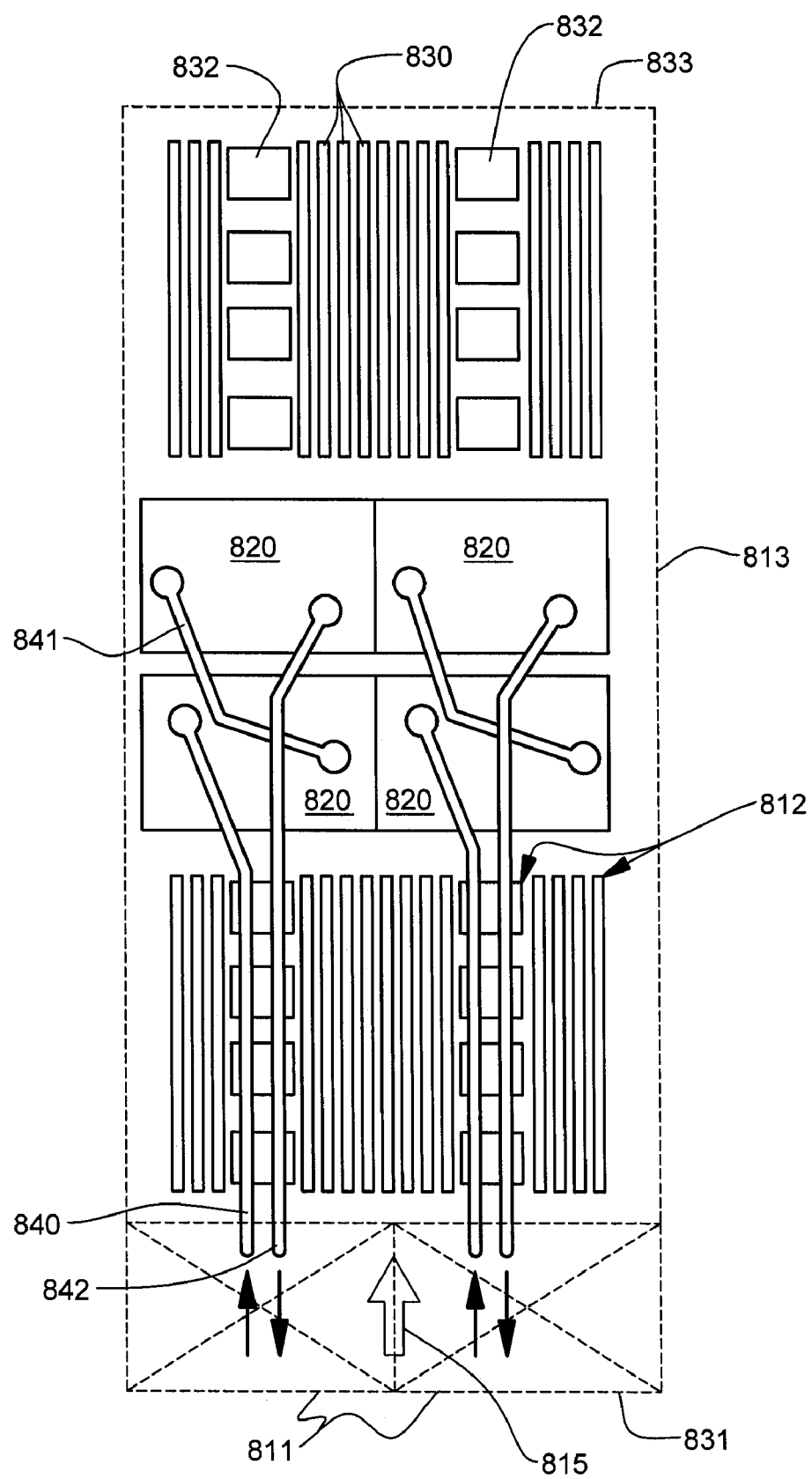
FIG. 8 is a plan view of the electronics drawer layout of FIG. 2 illustrating one alternate embodiment of a cooling system for cooling components of the electronics drawer, in accordance with an aspect of the present invention.

As noted above, in order to provide greater performance, it will eventually be necessary to increase processor chip powers beyond the point where forced air-cooling is feasible as a solution. To meet this increased cooling demand, a liquid-based cooling system is provided herein, with a liquid-cooled cold plate physically coupled to each primary heat generating component to be cooled. FIG. 8 is a depiction of the electronics drawer component layout of FIG. 2, shown with such a cooling system.

More particularly, FIG. 8 depicts one embodiment of an electronics drawer 813 component layout wherein one or more air moving devices 811 provide forced air flow 815 to cool multiple components 812 within electronics drawer 813. Cool air is taken in through a front 831 and exhausted out a back 833 of the drawer. The multiple components to be cooled include multiple processor modules to which liquid-cooled cold plates 820 (of a liquid-based cooling system) are coupled, as well as multiple arrays of memory modules 830 (e.g., dual in-line memory modules (DIMMs)) and multiple rows of memory support modules 832 (e.g., DIMM control modules) to which air-cooled heat sinks are coupled. In the embodiment illustrated, memory modules 830 and the memory support modules 832 are partially arrayed near front 831 of electronics drawer 813, and partially arrayed near back 833 of electronics drawer 813. Also, in the embodiment of FIG. 8, memory modules 830 and the memory support modules 832 are cooled by air flow 815 across the electronics drawer.

The illustrated liquid-based cooling system further includes multiple coolant-carrying tubes connected to and in fluid communication with liquid-cooled cold plates 820. The coolant-carrying tubes comprise sets of coolant-carrying tubes, with each set including (for example) a coolant supply tube 840, a bridge tube 841 and a coolant return tube 842. In this example, each set of tubes provides liquid coolant to a series-connected pair of cold plates 820 (coupled to a pair of processor modules). Coolant flows into a first cold plate of each pair via the coolant supply tube 840 and from the first cold plate to a second cold plate of the pair via bridge tube or line 841, which may or may not be thermally conductive. From the second cold plate of the pair, coolant is returned through the respective coolant return tube 842.

Figure 9:
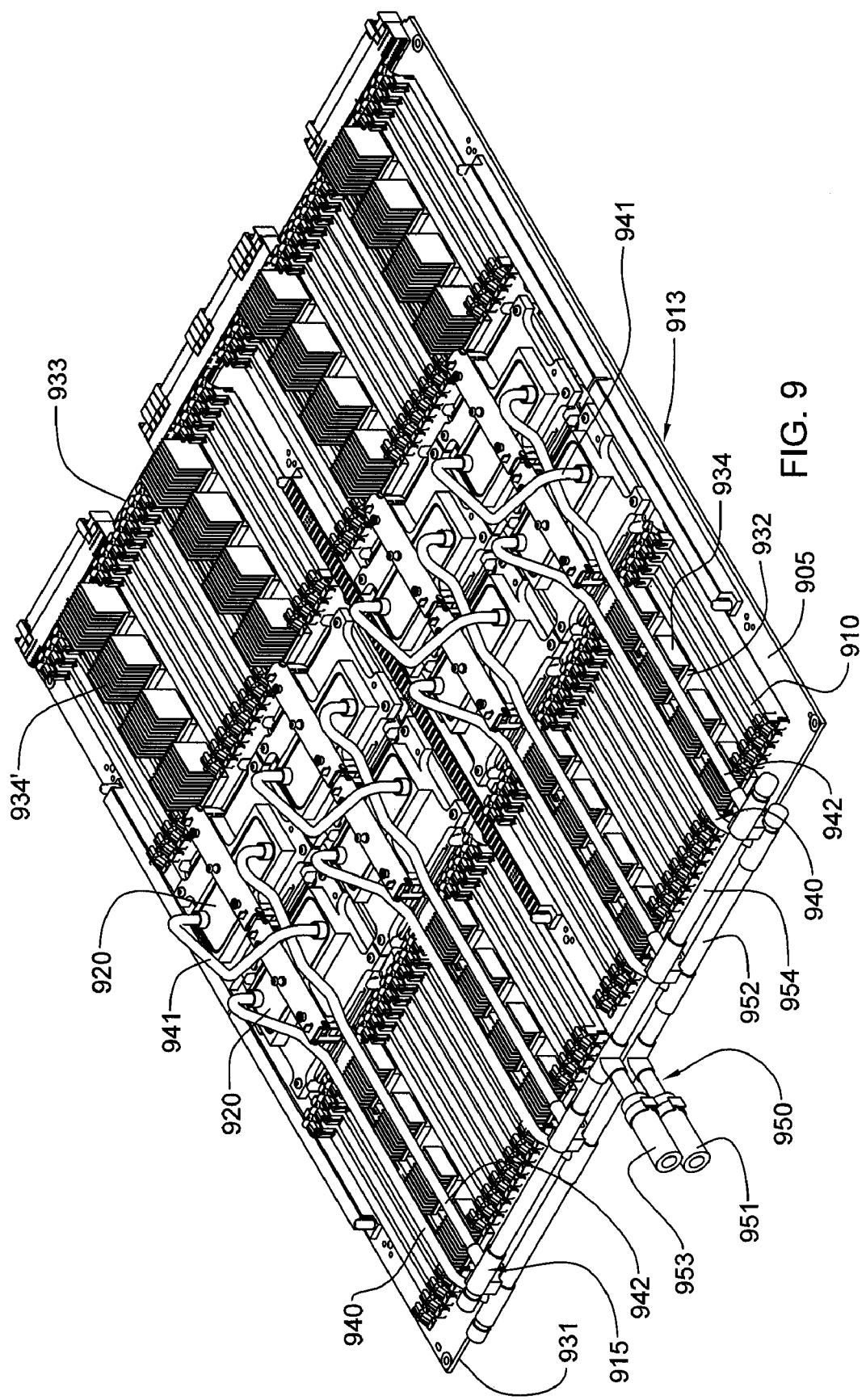
FIG. 9 depicts one detailed embodiment of a partially assembled electronics drawer layout, wherein the electronics system includes eight heat generating electronic components to be actively cooled, each having a respective liquid-cooled cold plate of a liquid-based cooling system coupled thereto, in accordance with an aspect of the present invention.

FIG. 9 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein is a robust and reliable liquid-based cooling system specially preconfigured and prefabricated as a monolithic structure for positioning within a particular electronics drawer.

FIG. 9 depicts is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 9 depicts a partially assembled electronics system 913 and an assembled liquid-based cooling system 915 coupled to primary heat generating components (e.g., including processor dies) to be cooled. In this embodiment, the electronics system is configured for (or as) an electronics drawer of an electronics rack, and includes, by way of example, a support substrate or planar 905, a plurality of memory module sockets 910 (with the memory modules (e.g., dual in-line memory modules) not shown), multiple rows of memory support modules 932 (each having coupled thereto an air-cooled heat sink 934), and multiple processor modules (not shown) disposed below the liquid-cooled cold plates 920 of the liquid-based cooling system 915.

In addition to liquid-cooled cold plates 920, liquid-based cooling system 915 includes multiple coolant-carrying tubes, including coolant supply tubes 940 and coolant return tubes 942 in fluid communication with respective liquid-cooled cold plates 920. The coolant-carrying tubes 940, 942 are also connected to a header (or manifold) subassembly 950 which facilitates distribution of liquid coolant to the coolant supply tubes and return of liquid coolant from the coolant return tubes 942. In this embodiment, the air-cooled heat sinks 934 coupled to memory support modules 932 closer to front 931 of electronics drawer 913 are shorter in height than the air-cooled heat sinks 934' coupled to memory support modules 932 near back 933 of electronics drawer 913. This size difference is to accommodate the coolant-carrying tubes 940, 942 since, in this embodiment, the header subassembly 950 is at the front 931 of the electronics drawer and the multiple liquid-cooled cold plates 920 are in the middle of the drawer.

Figure 10A:
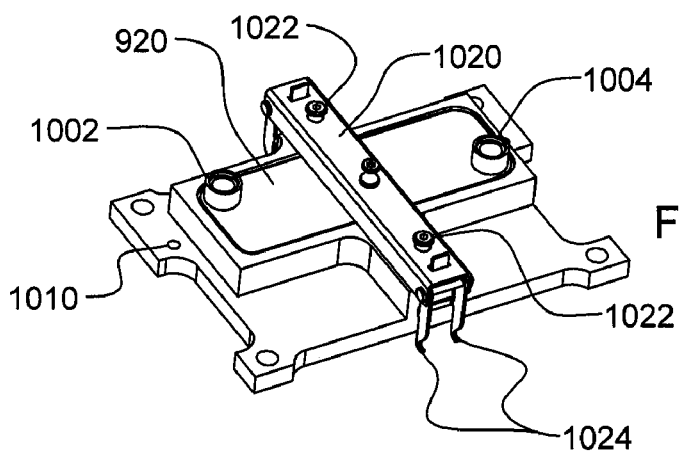
FIG. 10A depicts one embodiment of a liquid-cooled cold plate employed in the cooling system embodiment of FIG. 9, in accordance with an aspect of the present invention.

Referring more particularly to FIGS. 9 & 10A, liquid-based cooling system 915 comprises a preconfigured monolithic structure which includes multiple (pre-assembled) liquid-cooled cold plates 920 configured and disposed in spaced relation to engage respective heat generating electronic components. Each liquid-cooled cold plate 920 includes, in this embodiment, a liquid coolant inlet 1002 (see FIG. 10A) and a liquid coolant outlet 1004, as well as an attachment subassembly 1020 (i.e., a cold plate/load arm assembly). In a similar manner to the heat sink attachment approach of FIGS. 3-7, each attachment subassembly 1020 is employed to couple its respective liquid-cooled cold plate 920 to the associated electronic component to form the cold plate and electronic component assemblies depicted in FIG. 9. Alignment openings (i.e., thru-holes) 1010 are provided on the sides of the cold plate to receive alignment pins 332 (FIG. 3) or positioning dowels 1120 (FIG. 11) during the assembly process, as described further in the above-incorporated patent application entitled "Method of Assembling a Cooling System for a Multi-Component Electronics System". Additionally, connectors (or guide pins) 1022 are included within attachment subassembly 1020 which facilitate use of the attachment assembly, as explained below with reference to FIGS. 11 & 12. Note that load arms 1024 of connector assembly 1020 are also shown in FIG. 10A.

Figure 10B:
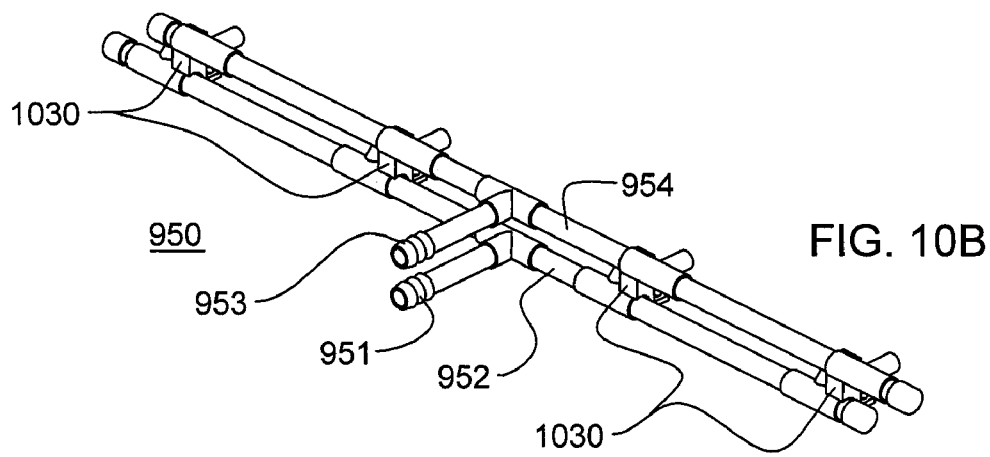
FIG. 10B depicts one embodiment of a liquid-coolant header subassembly employed in the cooling system embodiment of FIG. 9, in accordance with an aspect of the present invention.

As shown in FIGS. 9 & 10B, header subassembly 950 includes two liquid manifolds, i.e., a coolant supply header 952 and a coolant return header 954, which in one embodiment, are coupled together via supporting brackets 1030. In the monolithic cooling structure of FIG. 9, the coolant supply header 952 is metallurgically bonded in fluid communication to each coolant supply tube 940, while the coolant return header 954 is metallurgically bonded in fluid communication to each coolant return tube 952. A single coolant inlet 951 and a single coolant outlet 953 extend from the header subassembly for coupling to the electronics rack's coolant supply and return manifolds (not shown).

Figure 10C:
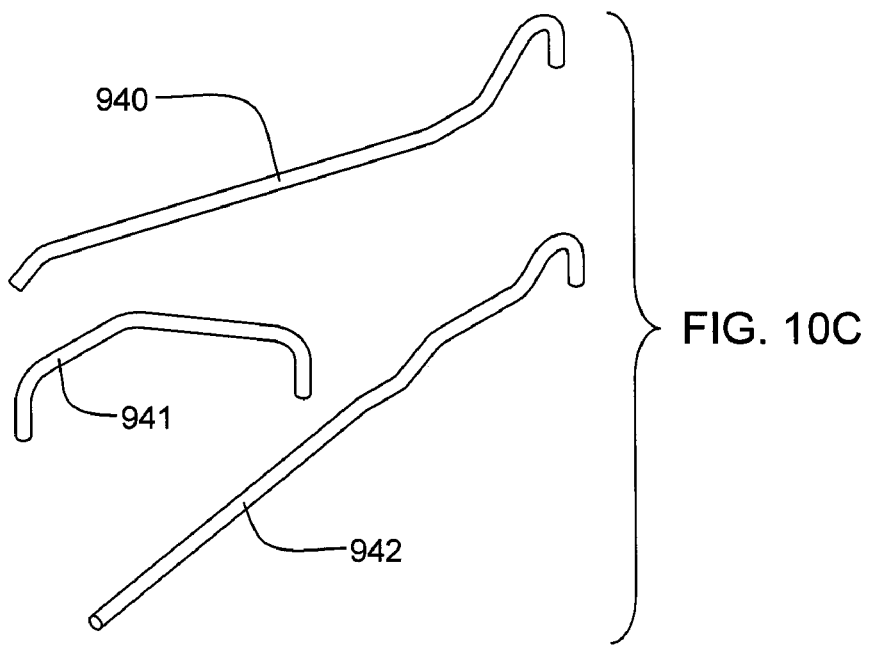
FIG. 10C depicts multiple preconfigured coolant-carrying tubes employed in the cooling system embodiment of FIG. 9, in accordance with an aspect of the present invention.

FIGS. 9 & 10C depict one embodiment of the preconfigured, coolant-carrying tubes. In addition to coolant supply tubes 940 and coolant return tubes 942, bridge tubes or lines 941 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 940, bridge tubes 941 and coolant return tubes 942 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

To summarize, a cooling system such as disclosed in connection with FIGS. 9-10C advantageously comprises a monolithic structure preconfigured for actively cooling multiple heat generating electronic components of an electronics system. The monolithic structure includes multiple liquid-cooled cold plates disposed in spaced relation, with each liquid-cooled cold plate of the multiple liquid-cooled cold plates being configured and positioned to couple to a respective heat generating electronic component of the multiple heat generating electronic components to be cooled. A plurality of coolant-carrying tubes are metallurgically bonded in fluid communication with multiple cold plates and with a liquid-coolant header subassembly. The liquid-coolant header subassembly includes a coolant supply header metallurgically bonded in fluid communication with the multiple coolant supply tubes and a coolant return header metallurgically bonded in fluid communication with multiple coolant return tubes. When in use, the multiple liquid-cooled cold plates are coupled to respective heat generating electronic components and liquid coolant is distributed through the header subassembly and coolant-carrying tubes to the cold plates for removal of heat generated by the electronic components.

Advantageously, the configuration depicted routes coolant in such a manner as to provide multiple parallel paths through multiple series-connected liquid-cooled cold plates. This configuration facilitates maintaining a desired drawer level pressure drop and a desired electronic component level temperature rise. The monolithic structure is mounted to, for example, the planar circuit board or stiffener via brackets mounted to the header subassembly and a cold plate to electronic component attachment subassembly (see FIGS. 11 & 12) similar to the mounting mechanism depicted and described in detail above in connection with FIGS. 3-7. The cooling system embodiment depicted is designed for direct attachment of the liquid-cooled cold plates to the electronics component to be cooled, which may include one or more bare dies, thereby eliminating the traditional lid and second thermal interface material.

Figure 11:
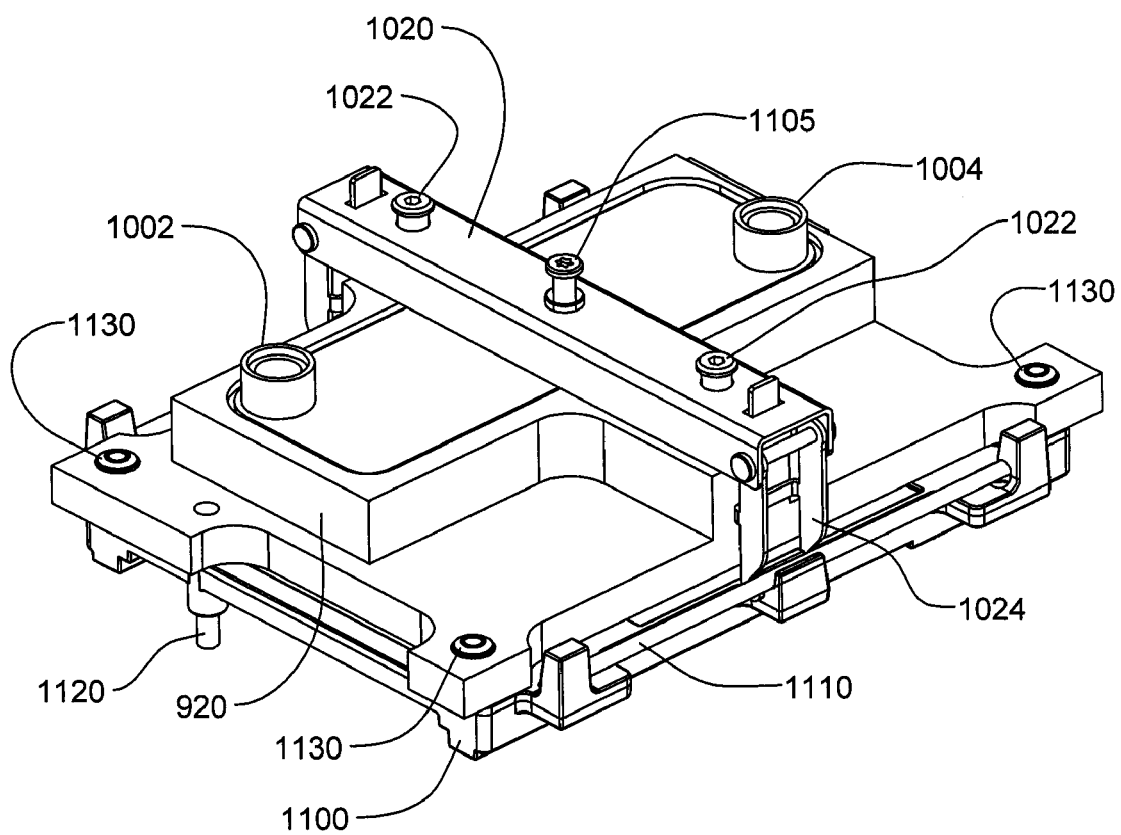
FIG. 11 is a perspective view of one embodiment of a liquid-cooled cold plate and electronic component assembly, in accordance with an aspect of the present invention.
Figure 12:
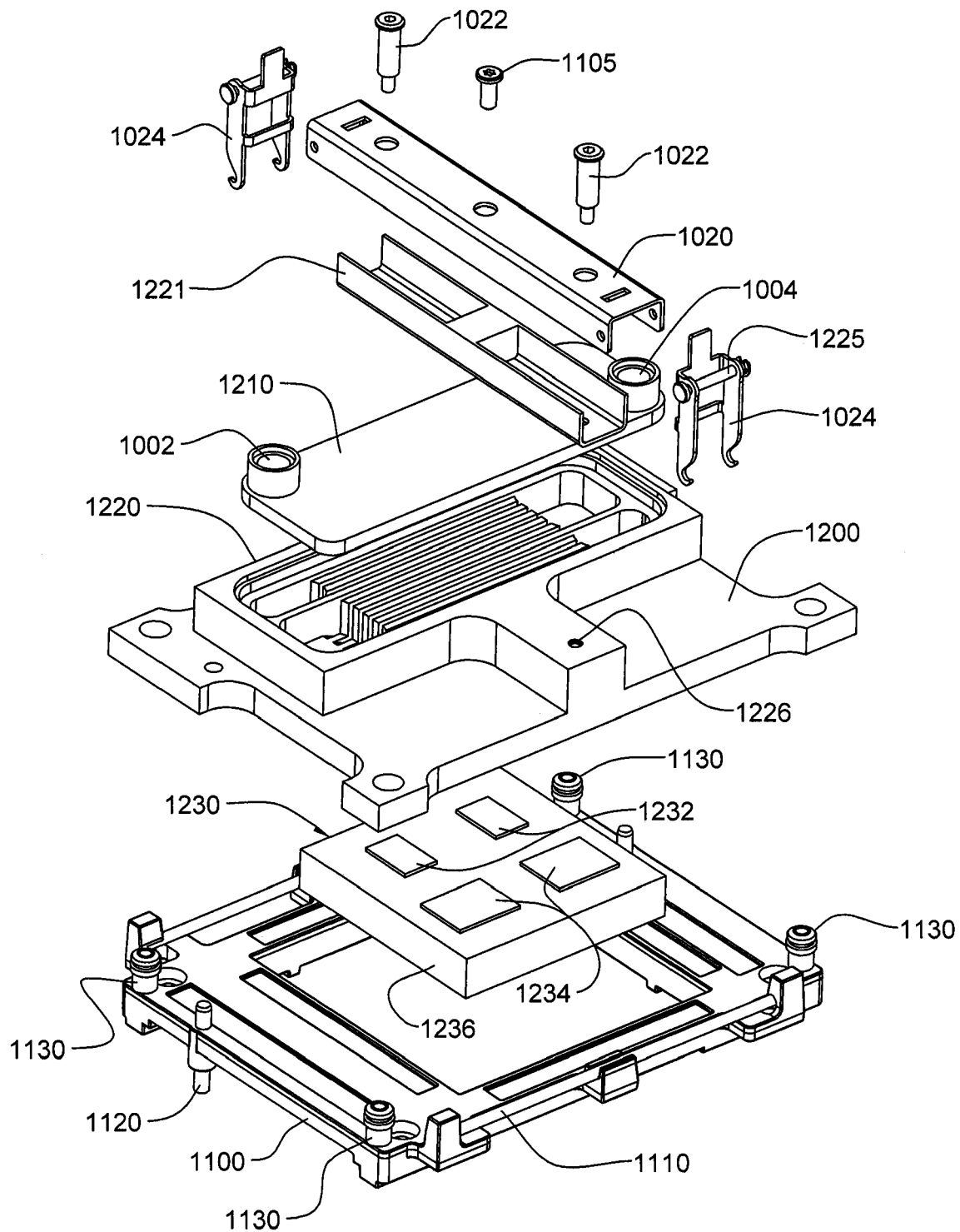
FIG. 12 is an exploded view of the liquid-cooled cold plate and electronic component assembly of FIG. 11, in accordance with an aspect of the present invention.

FIGS. 11 & 12 depict one embodiment of a liquid-cooled cold plate directly attached to an electronic component comprising multiple bare dies residing on a common carrier. As best shown in FIG. 12, the cold plate includes a cold plate base 1200, an active heat transfer region or structure 1220 and a cold plate lid 1210 having, for example, a coolant inlet 1002 and coolant outlet 1004. The heat generating electronic component 1230 includes, in this example, a carrier 1236 supporting two primary heat generating dies 1232 and two secondary heat generating dies 1234, each of which is assumed to be a bare die. Additionally, dies 1232 are assumed to generate greater heat than dies 1234. In the illustrated embodiment, the active heat transfer structure 1220 of the cold plate is configured to reside only over the primary heat generating dies 1232 for more active cooling of the dies compared with dies 1234.

Electronic component 1230 is disposed within a central opening in a loading frame 1100. When in use, loading frame 1100 is affixed to the electronic system's printed circuit board or planar, and sets the position for the loading and cooling hardware. Carrier 1236 of electronic component 1230 is assumed to be mechanically and electrically coupled to the printed circuit board as well. A thermal interface material, such as a thermally conductive gel, is disposed between the bare die back sides and the cold plate's contacting surface, which contacts the bare dies. Again, the active heat transfer structure 1220 of the cold plate is aligned (in this example) only over the high powered bare dies 1232 (e.g., processor dies). This embodiment seeks to cool the higher power chips preferentially in order to maintain a desired junction temperature in all of the devices being cooled.

The attachment subassembly again includes a pair of load springs 1110 connected to load frame 1100. Load frame 1100 is preferably made of an alloy material chosen for its low creep properties, such as Zamak 8, while load springs 1110 are preferably made of an alloy material chosen for its high tensile strength properties, such as a high strength music wire. Although two load springs 1110 are shown in FIGS. 11 & 12, those skilled in the art will appreciate that the present invention may be practiced with any number of load springs 1110. Load frame 1100 is again mounted to the printed circuit board via fasteners, such as the screws described above in connection with the embodiment of FIG. 5. Positioning dowels 1120 on either side of the frame engage respective thru-holes 1301 (FIG. 13) on either side of the cold plate base 1200. One or more non-influencing fasteners 1130 are used to secure the cold plate/load arm assembly to the load frame assembly. By way of example, four non-influencing fasteners 1130 are mounted on load frame 1100. The non-influencing fasteners 1130, which in one embodiment are threaded into respective bosses of load frame 1100, lock the cold plate in position without influencing the position of the cold plate in a manner similar to that described above in connection with FIGS. 3-6A.

The attachment subassembly again includes load arms 1024 hingedly connected via pins 1225 to a U-channel load bracket 1020, which has openings to accommodate load transfer block fasteners 1022. Fasteners 1022 are threaded at their distal ends to engage respective threaded openings 1226 in an upper surface of the cold plate base. Load transfer block fasteners 1022 further function as load bracket retaining dowels in this embodiment. A load transfer block 1221 is disposed below the load bracket 1020 and a load actuation screw 1105 applies compressive force to load transfer block 1221, which in turn applies a compressive load to the cold plate, and hence to the back side of the bare die of the electronic component to ensure a desired thermal interface material thickness, and thus a favorable thermal interface resistance between the bare dies and the contacting surface of the cold plate. As is known, the thermal resistance of the thermal interface material is inversely proportional to the material's thickness. Advantageously, the cold plate base and load transfer block are configured to distribute loading pressure across the raised, planar upper surface of the cold plate base.

Figure 13:
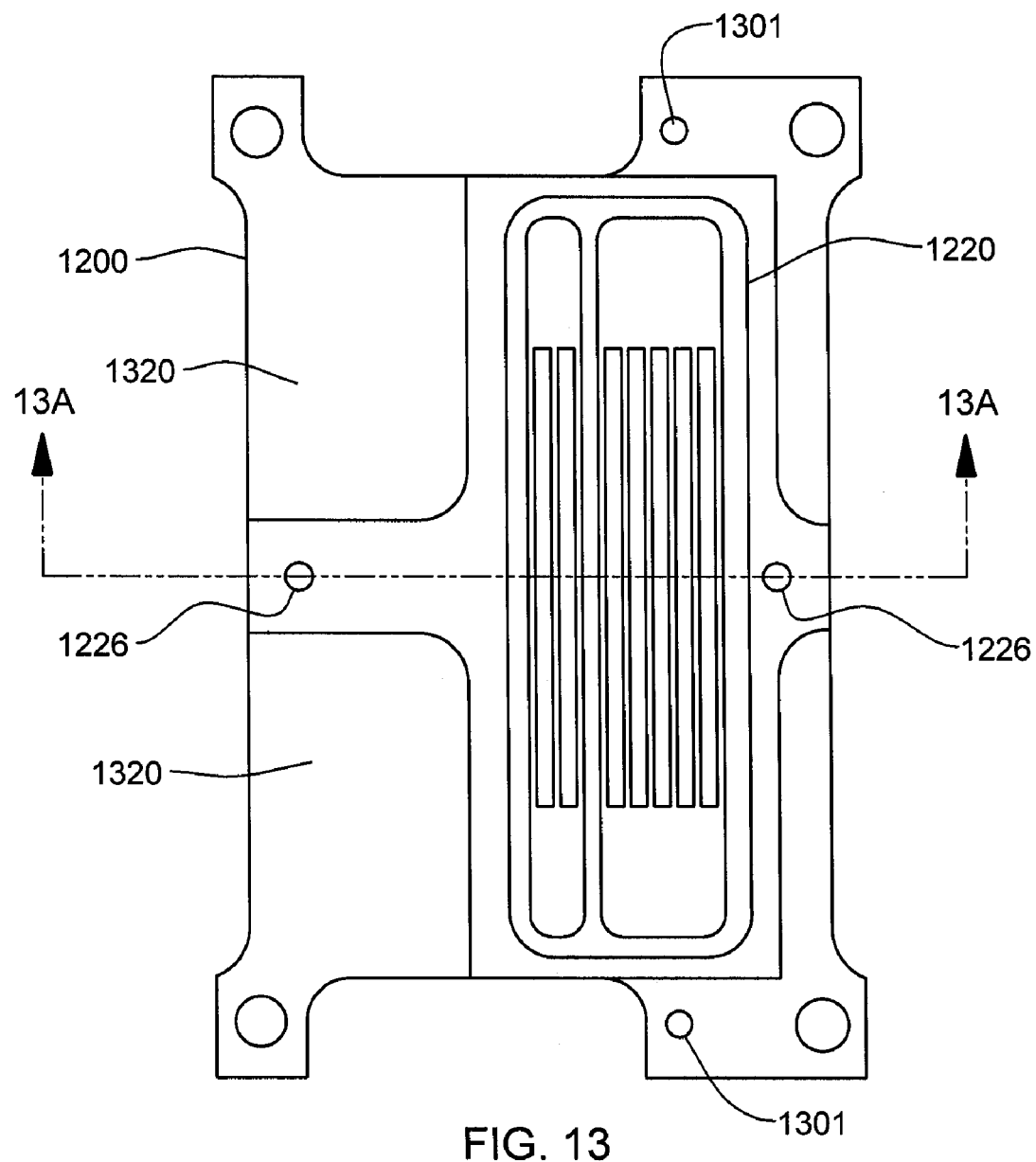
FIG. 13 is a top plan view of one embodiment of a liquid-cooled cold plate (shown with the cover removed) for a cooling system, in accordance with an aspect of the present invention.
Figure 13A:
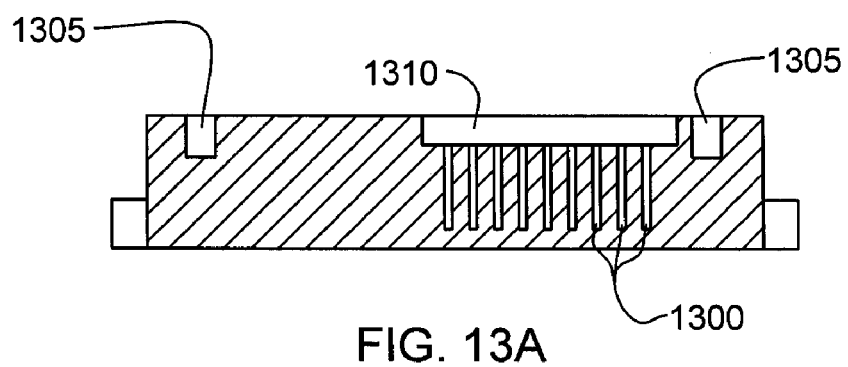
FIG. 13A is a cross-sectional elevational view of the liquid-cooled cold plate of FIG. 13, taken along line 13A-13A, in accordance with an aspect of the present invention.

FIGS. 13 & 13A depict one detailed embodiment of cold plate base 1200. As shown, base 1200 is again configured with active heat transfer structure 1220 extending only over a portion thereof. Within the active heat transfer structure 1220, multiple parallel channels 1300 are disposed for passing liquid coolant therethrough. Dowel receiving thru-holes 1301 are provided on either side of the active heat transfer structure for engaging positioning dowels 1120 (FIG. 12). Further, threaded openings 1226 are provided in the upper surface of the cold plate base 1200 and are located to receive respective load transfer block fasteners 1022 (FIG. 12), as described above. A brazing pocket 1310 is also shown in FIG. 13A for facilitating brazing of cold plate lid 1210 (FIG. 12) to cold plate base 1200. Base cutout areas 1320, which are provided for mass reduction, result in the raised, planar upper surface configuration (when the cold plate lid is attached) illustrated in FIG. 13.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims. For example, other non-influencing fastener arrangements may be used in lieu of the non-influencing fastener arrangements described above. Moreover, although non-influencing fasteners may be preferable, adhesives may be used in lieu of the non-influencing fasteners described, such as a pressure sensitive adhesive, UV-sensitive adhesive, thermal curing adhesive, epoxy or any other suitable adhesive.

What is claimed is:

1. A liquid-based cooling system for cooling an electronics system, the cooling system comprising:
    a monolithic structure preconfigured for cooling multiple heat generating electronic components of the electronics system when coupled thereto, the monolithic structure comprising:
        multiple liquid-cooled cold plates configured and disposed in spaced relation to engage respective heat generating electronic components of the multiple heat generating electronic components to be cooled;
        a plurality of coolant-carrying tubes metallurgically bonded in fluid communication with the multiple liquid-cooled cold plates;
        a liquid-coolant header subassembly metallurgically bonded in fluid communication with multiple coolant-carrying tubes of the plurality of coolant-carrying tubes, the liquid-coolant header subassembly comprising a coolant supply header bonded in fluid communication with multiple coolant supply tubes of the multiple coolant-carrying tubes and a coolant return header bonded in fluid communication with coolant return tubes of the multiple coolant-carrying tubes, wherein when in use, the multiple liquid-cooled cold plates engage the respective heat generating electronic components of the multiple heat generating electronic components, and liquid coolant is distributed through the liquid-coolant header subassembly and plurality of coolant-carrying tubes to the multiple liquid-cooled cold plates for removal of heat generated by the respective heat generating electronic components;
    wherein each heat generating electronic component to be cooled comprises at least one bare die, and wherein a surface of each liquid-cooled cold plate of the multiple liquid-cooled cold plates is configured to directly attach to the at least one bare die of the respective heat generating electronic component; and
    wherein at least one heat generating electronic component to be cooled comprises multiple bare dies, and wherein the surface of the liquid-cooled cold plate configured to couple to the at least one heat generating electronic component having the multiple bare dies is designed to directly attach to the multiple bare dies, the multiple bare dies comprising at least one primary heat generating die and at least one secondary heat generating die, and wherein the liquid-cooled cold plate configured to couple thereto comprises liquid-cooled channels disposed to extend over the at least one primary heat generating die without extending over the at least one secondary heat generating die when the liquid-cooled cold plate is in operative engagement with the at least one heat generating electronic component comprising the multiple bare dies.

2. The cooling system of claim 1, wherein the monolithic structure is preconfigured with the cold plates being in multiple sets of series-connected liquid-cooled cold plates, each set of series-connected liquid-cooled cold plates comprising n series-connected liquid-cooled cold plates, wherein n≧2 and wherein multiple parallel coolant flow paths are defined within the monolithic structure through the multiple sets of series-connected liquid-cooled cold plates when the cooling system is operational.

3. The cooling system of claim 2, wherein the n series-connected liquid-cooled cold plates of each set of n series-connected liquid-cooled cold plates are coupled in series fluid communication employing a respective set of coolant-carrying tubes of the plurality of coolant-carrying tubes, each respective set of coolant-carrying tubes comprising:
- a coolant supply tube metallurgically bonded between the coolant supply header of the liquid-coolant header subassembly and a first liquid-cooled cold plate of the respective set of n series-connected liquid-cooled cold plates;
- at least one bridge tube connecting a liquid-cooled cold plate of the n-series-connected liquid-cooled cold plates to another liquid-cooled cold plate of the respective set of n series-connected liquid-cooled cold plates; and
- a return tube metallurgically bonded between an $n^{th}$ liquid-cooled cold plate of the respective set of n series-connected liquid-cooled cold plates and the coolant return header of the liquid-coolant header subassembly.

4. The cooling system of claim 3, wherein the bridge tube of each respective set of coolant-carrying tubes is metallurgically bonded between the first liquid-cooled cold plate and the another liquid-cooled cold plate, and wherein the metallurgical bonding of each respective set of coolant-carrying tubes to the liquid-coolant header subassembly and to the respective set of n series-connected liquid-cooled cold plates is one of a weld, braze or solder bonding.

5. The cooling system of claim 1, wherein the multiple coolant-carrying tubes metallurgically bonded to the liquid-coolant header subassembly comprise multiple thermally conductive coolant-carrying tubes preconfigured to facilitate coupling of the monolithic structure to the multiple heat generating electronic components of the electronics system, and wherein the multiple thermally conductive coolant-carrying tubes are each metallurgically bonded in fluid communication to the liquid-coolant header subassembly employing one of a fluid-tight weld, braze or solder bond.

6. The cooling system of claim 5, wherein each thermally conductive coolant-carrying tube is metallurgically bonded in fluid communication to at least one respective liquid-cooled cold plate of the multiple liquid-cooled cold plates employing one of a fluid tight weld, braze or solder bond.

7. The cooling system of claim 1, wherein the at least one primary heat generating die comprises at least one processor die and the at least one secondary heat generating die comprises at least one non-processor die, and wherein each heat generating electronic component to be cooled comprises multiple bare dies, the multiple bare dies of each heat generating electronic component comprising the at least one primary heat generating die and the at least one secondary heat generating die, and wherein the liquid-cooled channels of each liquid-cooled cold plate of the monolithic structure, when positioned in operative engagement with the multiple heat generating electronic components, extend over the at least one primary heat generating die without extending over the at least one secondary heat generating die of the respective heat generating electronic component.

8. A liquid-based cooling system for cooling an electronics system, the cooling system comprising:
- a monolithic structure preconfigured for cooling multiple heat generating electronic components of the electronics system when coupled thereto, the monolithic structure comprising:
    - multiple liquid-cooled cold plates configured and disposed in spaced relation to engage respective heat generating electronic components of the multiple heat generating electronic components to be cooled;
    - a plurality of coolant-carrying tubes metallurgically bonded in fluid communication with the multiple liquid-cooled cold plates;
    - a liquid-coolant header subassembly metallurgically bonded in fluid communication with multiple coolant-carrying tubes of the plurality of coolant-carrying tubes, the liquid-coolant header subassembly comprising a coolant supply header bonded in fluid communication with multiple coolant supply tubes of the multiple coolant-carrying tubes and a coolant return header bonded in fluid communication with coolant return tubes of the multiple coolant-carrying tubes, wherein when in use, the multiple liquid-cooled cold plates engage the respective heat generating electronic components of the multiple heat generating electronic components, and liquid coolant is distributed through the liquid-coolant header subassembly and plurality of coolant-carrying tubes to the multiple liquid-cooled cold plates for removal of heat generated by the respective heat generating electronic components; and
    - wherein the monolithic structure further comprises multiple attachment subassemblies, each attachment subassembly being configured to mount a respective liquid-cooled cold plate to its respective heat generating electronic component, and wherein each liquid-cooled cold plate comprises a raised, planar upper surface and each attachment subassembly comprises a load transfer block disposed between a loading bracket and the raised, planar upper surface of the respective liquid-cooled cold plate, the load transfer block being configured to distribute loading pressure across the raised, planar upper surface of the respective liquid-cooled cold plate.

9. A cooled electronic system comprising:
- an electronics drawer of an electronics rack, the electronics drawer containing multiple heat generating electronic components to be cooled; and
- a liquid-based cooling system for cooling the multiple heat generating electronic components of the electronics drawer, the cooling system comprising:
    - a monolithic structure preconfigured for the electronics drawer and coupled to the multiple heat generating electronic components of the electronics drawer, the monolithic structure comprising:
        - multiple liquid-cooled cold plates preconfigured in spaced relation and coupled to respective heat generating electronic components of the multiple heat generating electronic components to be cooled;
        - a plurality of coolant-carrying tubes metallurgically bonded in fluid communication with the multiple liquid-cooled cold plates;
        - a liquid-coolant header subassembly metallurgically bonded in fluid communication with multiple coolant-carrying tubes of the plurality of coolant-carrying tubes, the liquid-coolant header subassembly comprising a coolant supply header bonded in fluid communication with multiple coolant supply tubes of the multiple coolant-carrying tubes and a coolant return header bonded in fluid communication with coolant return tubes of the multiple coolant-carrying tubes, wherein in operation, liquid coolant is distributed through the liquid-coolant header subassembly and plurality of coolant-carrying tubes to the multiple liquid-cooled cold plates for removal of heat generated by the respective heat generating electronic components of the electronics drawer; and
        - wherein the monolithic structure is preconfigured with multiple sets of series-connected liquid-cooled cold plates, each set of series-connected liquid-cooled cold plates comprising n series-connected liquid-cooled cold plates, wherein n≧2, and wherein multiple parallel coolant flow paths are defined within the monolithic structure through the multiple sets of series-connected liquid-cooled cold plates when the cooling system is operational.

10. The cooled electronic system of claim 9, wherein the n series-connected liquid-cooled cold plates of each set of n series-connected liquid-cooled cold plates are coupled in series fluid communication employing a respective set of coolant-carrying tubes of the plurality of coolant-carrying tubes, each respective set of coolant-carrying tubes comprising:
- a coolant supply tube metallurgically bonded between the coolant supply header of the liquid-coolant header subassembly and a first liquid-cooled cold plate of the respective set of n series-connected liquid-cooled cold plates;
- at least one bridge tube connecting a liquid-cooled cold plate of the n-series-connected liquid-cooled cold plates to another liquid-cooled cold plate of the respective set of n series-connected liquid-cooled cold plates; and
- a return tube metallurgically bonded between an $n^{th}$ liquid-cooled cold plate of the respective set of n series-connected liquid-cooled cold plates and the coolant return header of the liquid-coolant header subassembly.

11. The cooled electronic system of claim 9, wherein the multiple coolant-carrying tubes metallurgically bonded to the liquid-coolant header subassembly comprise multiple thermally conductive coolant-carrying tubes preconfigured to facilitate coupling of the monolithic structure to the multiple heat generating electronic components of the electronics drawer, and wherein the multiple thermally conductive coolant-carrying tubes are each metallurgically bonded in fluid communication to the liquid-coolant header subassembly employing one of a fluid-tight weld, braze or solder bond.

12. The cooled electronic system of claim 11, wherein each thermally conductive coolant-carrying tube is metallurgically bonded in fluid communication to at least one respective liquid-cooled cold plate of the multiple liquid-cooled cold plates employing one of a fluid tight weld, braze or solder bond.

13. The cooled electronic system of claim 9, wherein each heat generating electronic component to be cooled comprises at least one bare die, and wherein a surface of each liquid-cooled cold plate of the multiple liquid-cooled cold plates is directly attached to the at least one bare die of the respective heat generating electronic component.

14. The cooled electronic system of claim 13, wherein at least one heat generating electronic component to be cooled comprises multiple bare dies, and wherein the surface of the liquid-cooled cold plate coupled thereto is directly attached to the multiple bare dies, the multiple bare dies comprising at least one primary heat generating die and at least one secondary heat generating die, and wherein the liquid-cooled cold plate coupled thereto comprises liquid-cooled channels extending over the at least one primary heat generating die without extending over the at least one secondary heat generating die.

15. The cooled electronic system of claim 14, wherein the at least one primary heat generating die comprises at least one processor die and the at least one secondary heat generating die comprises at least one non-processor die, and wherein each heat generating electronic component to be cooled comprises multiple bare dies, the multiple bare dies of each heat generating electronic component comprising the at least one primary heat generating die and the at least one secondary heat generating die, and wherein liquid-cooled channels of each liquid-cooled cold plate of the monolithic structure extend over the respective at least one primary heat generating die without extending over the respective at least one secondary heat generating die.

16. The cooled electronic system of claim 9, wherein the monolithic structure further comprises multiple attachment subassemblies, each attachment subassembly being configured to mount a respective liquid-cooled cold plate to its respective heat generating electronic component, and wherein each liquid-cooled cold plate comprises a raised, planar upper surface and each attachment subassembly comprises a load transfer block disposed between a loading bracket and the raised, planar upper surface of the respective liquid-cooled cold plate, the load transfer block being configured to distribute loading pressure across the raised, planar upper surface of the respective liquid-cooled cold plate.

* * * * *